United States Statutory Invention Registration [19]

[11] Reg. Number: H891

Hashimoto [43] Published: Feb. 5, 1991

[54] AUTOMATIC ILLUMINATION SWITCHING DEVICE

[76] Inventor: Kazuo Hashimoto, 28-2 Komazawa, 2-chome, Setagaya-ku, Tokyo 154, Japan

[21] Appl. No.: 409,668

[22] Filed: Sep. 20, 1989

[30] Foreign Application Priority Data

Sep. 20, 1988 [JP] Japan ..... 63-236096

[51] Int. Cl.[5] ..... G10L 5/06; H03G 3/20

[52] U.S. Cl. ..... 381/43; 381/110; 367/198; 362/802; 200/61.01; 200/DIG. 20

[58] Field of Search ..... 381/41-46, 381/110; 367/197-199; 200/61.01, DIG. 20; 362/802; 315/360, 84, 120

[56] References Cited

U.S. PATENT DOCUMENTS 3,211,951 10/1965 Skinner et al. ..... 315/84
3,221,211 11/1965 Murphy et al. ..... 315/84
4,071,805 1/1978 Brock ..... 315/360
4,408,308 10/1983 Smith et al. ..... 367/197
4,630,248 12/1986 Scott ..... 367/197
4,797,924 1/1989 Schnars et al. ..... 381/43

*Primary Examiner*—Linda J. Wallace

[57] ABSTRACT

An automatic switching circuit controls operation of a light. The circuit includes a voice recognizer and a manual switch. The switching circuit turns the illuminator on instantly in response to an "ON" command input via the manual switch or via the voice recognizer. The switching circuit turns the illuminator off a predetermined period of time after detecting an "OFF" command input via said manual switch or via the voice recognizer.

12 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

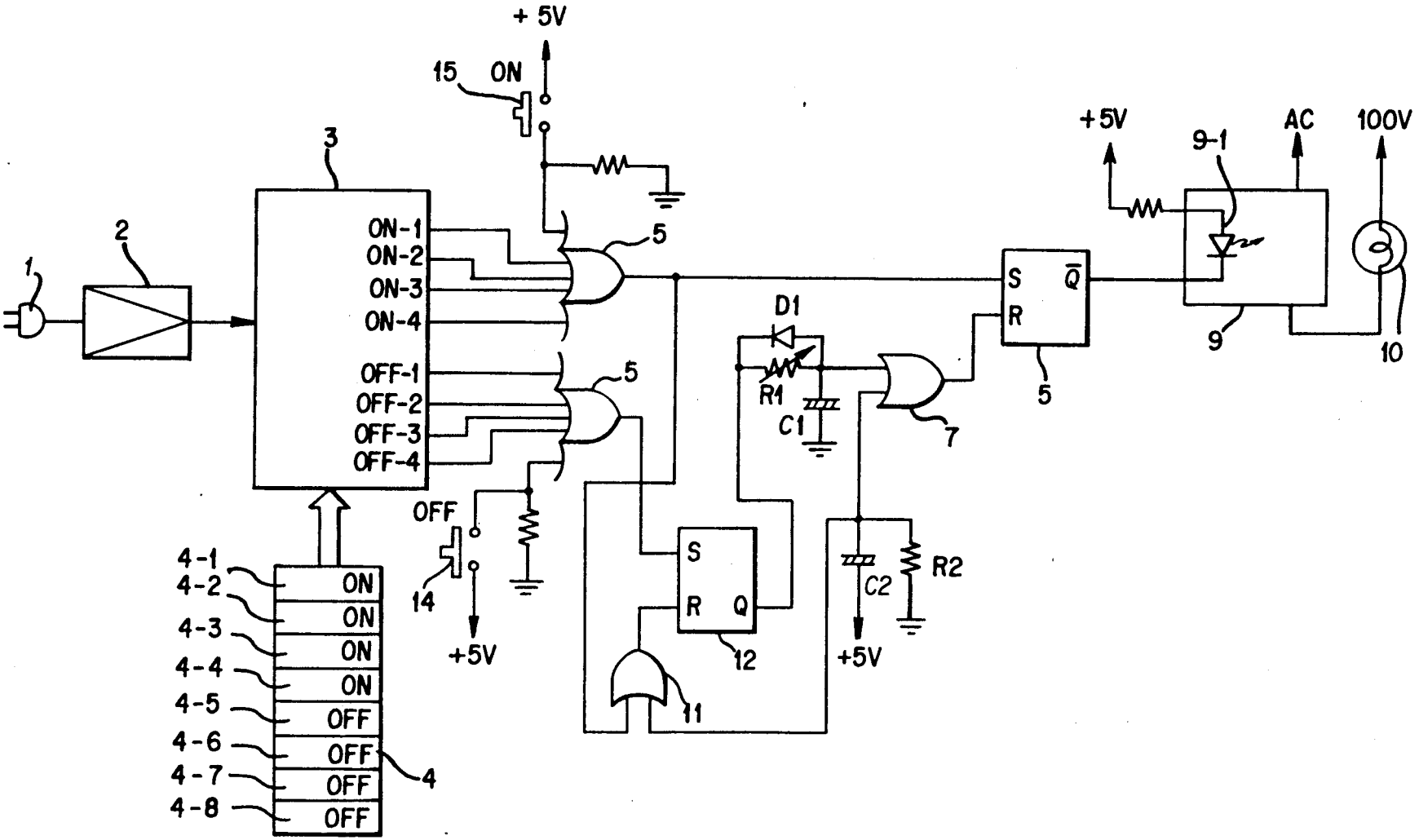
100V
10
AC
9-1
9
+5V
S
Q̄
R
5
7
R2
C2
+5V
D1
R1
C1
S
R
Q
12
11
5
5
+5V
15
ON
OFF
14
+5V
ON-1
ON-2
ON-3
ON-4
OFF-1
OFF-2
OFF-3
OFF-4
3
ON
ON
ON
ON
OFF
OFF
OFF
OFF
4
4-1
4-2
4-3
4-4
4-5
4-6
4-7
4-8
2
1

AUTOMATIC ILLUMINATION SWITCHING DEVICE

BACKGROUND OF THE INVENTION

The present invention relates to an illumination switching device.

A conventional illuminator is turned ON and OFF by a manual simple ON/OFF switch, a switch having one button for flip-flop ON and OFF, a device having a sensor for flip-flop ON and OFF, or a switch for ON and OFF by the voice recognition. The last switch is exemplified by a device for recognizing an extraordinary sound to repeat the flip-flop ON and OFF, or a device for recognizing the different voices or words generated for the ON and OFF.

In case of indoor lighting such as an illuminator, a switch for turning it ON instantly in response to a voice or by a sensor at the first incoming through a door of a room, also turns it OFF at the instant of outgoing from the room. So, the switch is troublesome in that it is necessary to pass a dark place for a while to go out of the room.

SUMMARY OF THE INVENTION

It is an object of the invention to provide an automatic illumination switching device for turning an illuminator ON by a sensor or in response to a voice at the instant when a person comes into a room, and for turning the illuminator OFF by the same action by the sensor or in response to the voice after the delay time is elapsed when the person goes out of the room. The delay time can be previously varied in accordance with the size of the room, so it is possible to automatically turn the illuminator OFF after the proper time, so that the illuminator can be kept ON until the person has gone out of the room.

The above and other objects, features and advantages of the present invention will become more apparent from the following description when taken in conjunction with the accompanying drawing in which a preferred embodiment of the present invention is shown by way of illustrative example.

BRIEF DESCRIPTION OF THE DRAWING

The single figure is a circuit diagram showing the embodiment of the present invention.

DESCRIPTION OF THE PREFERRED EMBODIMENT

The arrangement and operations of the preferred embodiment according to the present invention will be described.

Referring to the figure, reference numeral 1 designates a microphone; numeral 2 designates an amplifier; numeral 3 designates a voice recognizer using the T6658A of Toshiba, for example; and numeral 4 designates a memory wherein voice patterns for the aforementioned voice recognition are stored. In case the present device is used by four persons, the ON and OFF voice data of the four are stored. Alternatively, the ON and OFF voice data may be only one if the voice recognizer can recognize the voice of an indefinite person. In case, moreover, the ON voice made by the user is coincident with the voice data 4-1 of the memory 4, for example, an H level is outputted from an output terminal ON-1 of the voice recognizer 3. Reference numerals 5, 6, 7 and 11 designate OR gates; numerals 8 and 12 designate R-S type flip-flops; and numeral 9 designates a solid state relay for lighting a load electric bulb 10 while a light emitting diode 9-1 is ON in response to the output of the flip-flop 8.

Next, the specific operations will be described in the following. First of all, when the present device is energized, the flip-flop 8 is reset by the charged current of a capacitor C2. As a result, the solid state relay 9 is OFF so that the electric bulb 10 is not turned ON.

If the family member speaks "ON" to turn on the electric bulb 10, this voice is fed through the microphone 1 and the amplifier 2 to the speech recognizer 3. If the voice is to coincident with an ON voice data 4-2, for example, an output terminal ON-2 of the voice recognizer 3 takes an H level. By this output, the flip-flop 8 is held in its set state through the OR gate 5 so that its output $\overline{Q}$ takes an L level to turn ON the light emitting diode 9-1. As a result, the electric bulb 10 is instantly lit.

The speech recognizer 3 receives the sound of a TV set or the opening or closing noises of a door. If the sound other than the ON and OFF voice data comes into the voice recognizer 3, it is not naturally recognized. In this case, for example, the output terminal ON-2 held at the aforementioned H level is returned to the L level. Since, however, the ON state is stored in the flip-flop 8, the lighting of the electric bulb 10 continues in the normal manner.

Next, in case the family member speaks "OFF" when he goes out the room and in case this voice is coincident with voice data 4-6, the output terminal OFF-2 outputs the H level. This H-level signal sets the flip-flop through the OR gate 6. As a result, the output Q of the flip-flop 12 takes the H level to start the charging of a capacitor C1 through a variable resistor R1. When a time of ten seconds, for example, elapses so that the charge voltage of the capacitor C1 reaches a predetermined value, the flip-flop 8 is reset through the OR gate 7. At this time, the light emitting diode 9-1 is turned OFF to extinguish the electric bulb 10.

The flip-flop 12 has the same malfunction preventing action as that of the aforementioned flip-flop. Specifically, the electric bulb 10 is turned OFF, like the foregoing example, ten seconds after the voice of "OFF" in accordance with the time constant of R1×C1. If the opening or closing noises of the door come into the voice recognizer 3 within that ten seconds, the aforementioned output terminal OFF-2 is returned from the H level to the L level. As a result, if the charging of the capacitor is started through the output terminal OFF-2, the OR gate 6 and the variable resistor R1 but without the flip-flop 12 and if the door noises come in before the charging is not ended, this charging is ended in its course so that the predetermined bulb 10 is not turned ON. This can be avoided if the charging is accomplished through the aforementioned flip-flop 12. Incidentally, the set state of this flip-flop 12 is reset when the output of the OR gate is raised to the H level by the ON voice.

If, on the other hand, the family member comes back to the room for a thing he left during the delay operation determined by the variable resistor R1 and the capacitor C1 so as to turn OFF the electric bulb 10 and he speaks "ON", the output terminal ON-2, for example, takes the H level in response to the "ON" voice. Then, the flip-flop 12 is reset through the OR gate 5, as has been described hereinbefore. As a result of this resetting, the output Q of the flip-flop 12 is returned from the H to L levels so that the electric charges being stored are promptly discharged to the output Q through a diode D1. As a result, the electric bulb 10 is continuously lit without resetting the flip-flop 8.

Next, the operation by a manual switch will be described in the following. Reference numeral 13 designates a manual switch for turning ON the electric bulb 10, and numeral 14 designates a manual switch for turning OFF the electric bulb 10. These manual switches are connected with the aforementioned OR gates 5 and 6, and their operations will not be described because they are apparent from the foregoing descriptions. If these two manual switches are replaced by one manual switch which is connected with the clock terminal of a binary flip-flop such that the outputs Q and $\overline{Q}$ of this binary flip-flop are shared between the OR gates 5 and 6, the electric bulb 10 can be turned ON, if the single manual switch is depressed and released, and OFF after a predetermined delay if the switch is again depressed and released.

As has been described hereinbefore, according to the present invention, when the illuminator of a room is to be turned ON and OFF by the sensor or in response to the voice, it is turned ON instantly but turned OFF after it is left lit for several seconds or a preset time awaiting the outgoing even if the OFF instruction is provided. Thus, the present invention provides the most proper method having no danger, especially for the old so that it can enjoy high practical effects.

Although a certain preferred embodiment has been shown and described, it should be understood that many changes and modifications may be made therein without departing from the scope of the invention.

I claim:

1. An automatic illuminator switching circuit comprising:

a voice recognizer for detecting a spoken command to turn the illuminator on and a spoken command to turn the illuminator off;

an illuminator switch for turning an illuminator on and off; wherein said voice recognizer is connected to control said illuminator switch to turn the illuminator on instantly in response to the command to turn the illuminator on, and to turn the illuminator off a predetermined period of time after detecting the command to turn the illuminator off.

2. An automatic illuminator switching circuit as in claim 1 further comprising:

means to sustain an on state of said illuminator switch despite external noises.

3. An automatic illuminator switching circuit as in claim 2 wherein said means to sustain an on state of said illuminator switch comprises a flip-flop connected between said voice recognizer and said illuminator switch wherein said flip-flop is set by an output of the voice recognizer indicating detection of a spoken command to turn the illuminator on and is reset only at the predetermined time period after the voice recognizer detects a command to turn the illuminator off.

4. An automatic illuminator switching circuit as in claim 1 further comprising:

a preventing device preventing failure to turn off the illuminator after the predetermined period due to noises detected by the voice recognizer during the predetermined period.

5. An automatic illuminator switching circuit according to claim 4 wherein said preventing device comprises a flip-flop connected between the voice recognizer and the illuminator switch wherein said flip-flop is set by a signal from said voice recognizer indicating detection of a command to turn said illuminator off.

6. An automatic illuminator switching circuit comprising:

a voice recognizer for detecting a spoken command to turn the illuminator on and a spoken command to turn the illuminator off; and an illuminator switch for turning the illuminator on and off;

manual switch means for inputting commands to turn the illuminator on and off; and a control circuit responsive to commands received via said voice recognizer and said manual switch means to control said illuminator switch to turn the illuminator on instantly in response to a command to turn the illuminator on, and to turn the illuminator off a predetermined period of time after detecting a command to turn the illuminator off.

7. An automatic illuminator switching circuit as in claim 6, wherein said voice recognizer includes a memory storing voice data for recognition of ON and OFF commands spoken by a plurality of specific persons.

8. An automatic illuminator switching circuit as in claim 6, wherein said voice recognizer includes means to respond to ON and OFF commands spoken by anyone.

9. An automatically switched illuminator circuit comprising:

an illuminator in a room of a building;

a voice recognizer for detecting a spoken command to turn the illuminator on and a spoken command to turn said illuminator off; and an illuminator switch for turning said illuminator on and off; wherein said voice recognizer is connected to control said illuminator switch to turn the illuminator on instantly in response to the command to turn the illuminator on, and to turn the illuminator off a predetermined period of time after detecting the command to turn the illuminator off.

10. An automatically switched illuminator circuit as in claim 9, further comprising means to sustain an on state of said illuminator switch despite external noises.

11. An automatically switched illuminator circuit as in claim 9 further comprising a preventing device which prevents failure to turn off the illuminator after the predetermined period due to noise detected by the voice recognizer during the predetermined period.

12. An automatically switched illuminator circuit as in claim 9 further comprising:

manual switch means for inputting commands to turn the illuminator on and off; and a control circuit connected to control said illuminator switch to turn the illuminator on instantly in response to a command input via said manual switch means to turn the illuminator on, and to turn the illuminator off a predetermined period of time after detecting a command input via said manual switch means to turn the illuminator off.

* * * * *